US010960465B2

(12) United States Patent
DeMuth et al.

(10) Patent No.: US 10,960,465 B2
(45) Date of Patent: Mar. 30, 2021

(54) LIGHT RECYCLING FOR ADDITIVE MANUFACTURING OPTIMIZATION

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: SEURAT TECHNOLOGIES, INC., Mountain View, CA (US)

( * ) Notice: Subject to any disclaimer, the term of this patent is extended or adjusted under 35 U.S.C. 154(b) by 46 days.

(21) Appl. No.: 15/337,201

(22) Filed: Oct. 28, 2016

(65) Prior Publication Data

US 2017/0123237 A1    May 4, 2017

Related U.S. Application Data

(60) Provisional application No. 62/248,758, filed on Oct. 30, 2015, provisional application No. 62/248,765, (Continued)

(51) Int. Cl.
*B29C 64/264* (2017.01)
*B29C 64/268* (2017.01)
(Continued)

(52) U.S. Cl.
CPC .............. *B22F 3/1055* (2013.01); *B22F 3/24* (2013.01); *B23K 15/002* (2013.01);
(Continued)

(58) Field of Classification Search
CPC ........................... B29C 64/264; B29C 64/268
See application file for complete search history.

(56) References Cited

U.S. PATENT DOCUMENTS

| 4,247,508 A | 1/1981 | Housholder |
| 4,944,817 A | 7/1990 | Bourell |
| (Continued) | | |

FOREIGN PATENT DOCUMENTS

| CN | 1593817 A | 3/2005 |
| DE | 102013205029 A1 | 9/2014 |
| (Continued) | | |

OTHER PUBLICATIONS

"Reference Guide: How to Combine Lasers", Sep. 20, 2012 (Year: 2012).*

*Primary Examiner* — Jacob T Minskey
*Assistant Examiner* — George W. Brady
(74) *Attorney, Agent, or Firm* — David R. Stevens; Stevens Law Group

(57) ABSTRACT

A method and an apparatus pertaining to recycling and reuse of unwanted light in additive manufacturing can multiplex multiple beams of light including at least one or more beams of light from one or more light sources. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light.

13 Claims, 11 Drawing Sheets

Related U.S. Application Data filed on Oct. 30, 2015, provisional application No. 62/248,770, filed on Oct. 30, 2015, provisional application No. 62/248,776, filed on Oct. 30, 2015, provisional application No. 62/248,783, filed on Oct. 30, 2015, provisional application No. 62/248,791, filed on Oct. 30, 2015, provisional application No. 62/248,799, filed on Oct. 30, 2015, provisional application No. 62/248,966, filed on Oct. 30, 2015, provisional application No. 62/248,968, filed on Oct. 30, 2015, provisional application No. 62/248,969, filed on Oct. 30, 2015, provisional application No. 62/248,980, filed on Oct. 30, 2015, provisional application No. 62/248,989, filed on Oct. 30, 2015, provisional application No. 62/248,780, filed on Oct. 30, 2015, provisional application No. 62/248,787, filed on Oct. 30, 2015, provisional application No. 62/248,795, filed on Oct. 30, 2015, provisional application No. 62/248,821, filed on Oct. 30, 2015, provisional application No. 62/248,829, filed on Oct. 30, 2015, provisional application No. 62/248,833, filed on Oct. 30, 2015, provisional application No. 62/248,835, filed on Oct. 30, 2015, provisional application No. 62/248,839, filed on Oct. 30, 2015, provisional application No. 62/248,841, filed on Oct. 30, 2015, provisional application No. 62/248,847, filed on Oct. 30, 2015, provisional application No. 62/248,848, filed on Oct. 30, 2015.

(51) Int. Cl.

| | | |
|---|---|---|
| *B22F 3/105* | (2006.01) | |
| *B23K 26/342* | (2014.01) | |
| *G02B 27/14* | (2006.01) | |
| *B29C 64/386* | (2017.01) | |
| *B33Y 10/00* | (2015.01) | |
| *B33Y 30/00* | (2015.01) | |
| *B33Y 40/00* | (2020.01) | |
| *B33Y 50/02* | (2015.01) | |
| *B23K 26/144* | (2014.01) | |
| *B23K 26/70* | (2014.01) | |
| *B23K 26/16* | (2006.01) | |
| *B28B 1/00* | (2006.01) | |
| *B23K 26/142* | (2014.01) | |
| *B33Y 70/00* | (2020.01) | |
| *B33Y 99/00* | (2015.01) | |
| *G05B 17/02* | (2006.01) | |
| *G02B 7/14* | (2021.01) | |
| *G02B 15/04* | (2006.01) | |
| *G02B 26/08* | (2006.01) | |
| *G02F 1/1333* | (2006.01) | |
| *G02F 1/135* | (2006.01) | |
| *B23K 15/00* | (2006.01) | |
| *B23K 37/04* | (2006.01) | |
| *B23K 26/00* | (2014.01) | |
| *B23K 26/082* | (2014.01) | |
| *B23K 26/12* | (2014.01) | |
| *B23K 15/06* | (2006.01) | |
| *B23K 26/03* | (2006.01) | |
| *G02F 1/01* | (2006.01) | |
| *H01S 5/00* | (2006.01) | |
| *H01S 5/40* | (2006.01) | |
| *B33Y 80/00* | (2015.01) | |
| *B23K 26/36* | (2014.01) | |
| *B25J 11/00* | (2006.01) | |
| *B23K 26/08* | (2014.01) | |
| *B22F 3/24* | (2006.01) | |
| *G02B 7/16* | (2021.01) | |
| *G02B 7/182* | (2021.01) | |
| *G02B 15/10* | (2006.01) | |
| *G02B 19/00* | (2006.01) | |
| *G02B 27/00* | (2006.01) | |
| *B23K 101/00* | (2006.01) | |
| *B23K 101/02* | (2006.01) | |
| *B23K 101/24* | (2006.01) | |
| *B23K 103/00* | (2006.01) | |
| *G07C 3/14* | (2006.01) | |
| *B29K 105/00* | (2006.01) | |
| *G02B 27/09* | (2006.01) | |
| *G02B 27/28* | (2006.01) | |

(52) U.S. Cl.
CPC ...... *B23K 15/0006* (2013.01); *B23K 15/0013* (2013.01); *B23K 15/0026* (2013.01); *B23K 15/0086* (2013.01); *B23K 15/0093* (2013.01); *B23K 15/06* (2013.01); *B23K 26/0006* (2013.01); *B23K 26/03* (2013.01); *B23K 26/032* (2013.01); *B23K 26/082* (2015.10); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/342* (2015.10); *B23K 26/36* (2013.01); *B23K 26/702* (2015.10); *B23K 26/703* (2015.10); *B23K 26/704* (2015.10); *B23K 37/0408* (2013.01); *B23K 37/0426* (2013.01); *B25J 11/00* (2013.01); *B28B 1/001* (2013.01); *B29C 64/264* (2017.08); *B29C 64/268* (2017.08); *B29C 64/386* (2017.08); *B33Y 10/00* (2014.12); *B33Y 30/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02B 26/0816* (2013.01); *G02B 27/0068* (2013.01); *G02B 27/141* (2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 2003/1056* (2013.01); *B22F 2003/1057* (2013.01); *B22F 2003/1058* (2013.01); *B22F 2003/1059* (2013.01); *B22F 2003/247* (2013.01); *B22F 2003/248* (2013.01); *B22F 2998/10* (2013.01); *B22F 2999/00* (2013.01); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B29K 2105/251* (2013.01); *G02B 27/0905* (2013.01); *G02B 27/283* (2013.01); *G02B 27/286* (2013.01); *G05B 2219/49023* (2013.01); *G07C 3/146* (2013.01); *Y02P 10/295* (2015.11); *Y02P 80/40* (2015.11)

(56) References Cited

U.S. PATENT DOCUMENTS 5,155,324 A 10/1992 Deckard
5,236,637 A 8/1993 Hull

(56) References Cited

U.S. PATENT DOCUMENTS

| | | |
|---|---|---|
| 5,314,003 A | 5/1994 | Mackay |
| 5,382,308 A | 1/1995 | Bourell |
| 5,508,489 A | 4/1996 | Benda |
| 5,640,667 A | 6/1997 | Freitag |
| 5,674,414 A | 10/1997 | Schweizer |
| 5,837,960 A | 11/1998 | Lewis |
| 6,005,717 A | 12/1999 | Neuberger |
| 6,053,615 A | 4/2000 | Peterson |
| 6,064,528 A | 5/2000 | Simpson, Jr. |
| 6,183,092 B1 | 2/2001 | Troyer |
| 6,405,095 B1 | 6/2002 | Jang |
| 6,462,306 B1 | 10/2002 | Kitai |
| 6,560,001 B1 | 5/2003 | Igasaki |
| 6,666,556 B2 | 12/2003 | Hansen |
| 6,676,892 B2 | 1/2004 | Das |
| 6,717,106 B2 | 4/2004 | Nagano |
| 6,721,096 B2 | 4/2004 | Bruzzone |
| 6,781,763 B1 | 8/2004 | Tamburino |
| 7,088,432 B2 | 8/2006 | Zhang |
| 7,113,324 B2 | 9/2006 | Lee |
| 7,234,820 B2 | 6/2007 | Harbers |
| 7,444,046 B2 | 10/2008 | Karlsen |
| 7,509,738 B2 | 3/2009 | Adams |
| 7,569,174 B2 | 8/2009 | Ruatta |
| 7,713,048 B2 | 5/2010 | Perret |
| 7,820,241 B2 | 10/2010 | Perret |
| 8,199,787 B2 | 6/2012 | Deri |
| 8,462,828 B1 | 6/2013 | Estes |
| 8,514,475 B2 | 8/2013 | Deri |
| 8,525,943 B2 | 9/2013 | Burgess |
| 8,553,311 B2 | 10/2013 | Kleinert |
| 8,568,646 B2 | 10/2013 | Wang et al. |
| 8,666,142 B2 | 3/2014 | Shkolnik |
| 8,784,720 B2 | 7/2014 | Oberhofer et al. |
| 8,801,418 B2 | 8/2014 | El-Siblani |
| 8,815,143 B2 | 8/2014 | John |
| 8,902,497 B2 | 12/2014 | Erlandson |
| 8,982,313 B2 | 3/2015 | Escuti |
| 9,114,478 B2 | 8/2015 | Scott |
| 9,130,349 B2 | 9/2015 | Volodin |
| 9,136,668 B2 | 9/2015 | Bayramian |
| 9,172,208 B1 | 10/2015 | Dawson |
| 9,186,847 B2 | 11/2015 | Fruth |
| 9,192,056 B2 | 11/2015 | Rubenchik |
| 9,283,593 B2 | 3/2016 | Bruck |
| 9,308,583 B2 | 4/2016 | El-Dasher |
| 9,331,452 B2 | 5/2016 | Bayramian |
| 9,348,208 B2 | 5/2016 | Suga |
| 9,409,255 B1 | 8/2016 | Martinsen |
| 9,522,426 B2 | 12/2016 | Das |
| 9,573,193 B2 | 2/2017 | Buller |
| 9,815,139 B2 | 11/2017 | Bruck |
| 9,855,625 B2 | 1/2018 | El-Dasher |
| 9,910,346 B2 | 3/2018 | Huang |
| 9,962,767 B2 | 5/2018 | Buller |
| 10,166,751 B2 | 1/2019 | Kramer |
| 10,195,692 B2 | 2/2019 | Rockstroh |
| 10,195,693 B2 | 2/2019 | Buller |
| 10,279,598 B2 | 5/2019 | Deppe |
| 10,328,685 B2 | 6/2019 | Jones |
| 10,335,901 B2 | 7/2019 | Ferrar |
| 2002/0015654 A1 | 2/2002 | Das |
| 2002/0090313 A1 | 7/2002 | Wang |
| 2002/0149137 A1 | 10/2002 | Jang |
| 2002/0149852 A1* | 10/2002 | Dubinovsky ........ H04N 9/3114 359/618 |
| 2003/0052105 A1 | 3/2003 | Nagano |
| 2004/0240059 A1 | 12/2004 | Li |
| 2005/0083498 A1 | 4/2005 | Jeng |
| 2006/0034557 A1 | 2/2006 | Li |
| 2006/0091120 A1 | 5/2006 | Markle |
| 2006/0209409 A1 | 9/2006 | Li |
| 2006/0232750 A1 | 10/2006 | Yokote |
| 2007/0024825 A1 | 2/2007 | Stephanes |
| 2007/0053074 A1 | 3/2007 | Krijn et al. |
| 2007/0122560 A1 | 5/2007 | Adams |
| 2007/0273797 A1 | 11/2007 | Silverstein |
| 2008/0157412 A1 | 7/2008 | Kihara et al. |
| 2008/0192205 A1* | 8/2008 | De Vaan ............ G02F 1/13362 353/20 |
| 2008/0231953 A1 | 9/2008 | Young |
| 2008/0246705 A1 | 10/2008 | Russell |
| 2008/0262659 A1 | 10/2008 | Huskamp |
| 2008/0285129 A1 | 11/2008 | Magarill et al. |
| 2009/0020901 A1 | 1/2009 | Schillen |
| 2009/0206065 A1 | 8/2009 | Kruth |
| 2009/0221422 A1 | 9/2009 | Miller |
| 2010/0045956 A1* | 2/2010 | Van De Kerkhof ........................ G01M 11/0264 355/71 |
| 2010/0089881 A1 | 4/2010 | Bruland |
| 2010/0176539 A1 | 7/2010 | Higashi |
| 2010/0202048 A1* | 8/2010 | Amitai ................ H04N 13/344 359/485.02 |
| 2010/0253769 A1* | 10/2010 | Coppeta ............ G02B 27/1026 248/346.01 |
| 2011/0019705 A1 | 1/2011 | Adams |
| 2011/0033887 A1 | 2/2011 | Fang |
| 2011/0051092 A1 | 3/2011 | Mashitani |
| 2011/0278269 A1 | 11/2011 | Gold |
| 2012/0039565 A1 | 2/2012 | Klein |
| 2012/0188515 A1 | 7/2012 | Huang |
| 2013/0056910 A1* | 3/2013 | Houbertz-Krauss ... B33Y 30/00 264/401 |
| 2013/0077315 A1 | 3/2013 | Moffatt |
| 2013/0102447 A1 | 4/2013 | Strong |
| 2013/0112672 A1 | 5/2013 | Keremes |
| 2013/0136868 A1 | 5/2013 | Bruck |
| 2013/0270750 A1 | 10/2013 | Green |
| 2013/0271800 A1 | 10/2013 | Kanugo |
| 2013/0300286 A1 | 11/2013 | Ljungblad |
| 2013/0302533 A1 | 11/2013 | Bruck |
| 2014/0085631 A1 | 3/2014 | Lacour |
| 2014/0154088 A1 | 6/2014 | Etter |
| 2014/0252687 A1 | 9/2014 | El-Dasher |
| 2014/0263209 A1 | 9/2014 | Burris |
| 2014/0271965 A1 | 9/2014 | Ferrar |
| 2014/0367894 A1 | 12/2014 | Kramer |
| 2015/0132173 A1 | 5/2015 | Bruck |
| 2015/0165556 A1 | 6/2015 | Jones |
| 2015/0211083 A1 | 7/2015 | Gabilondo |
| 2015/0028361 A1 | 10/2015 | Maeda |
| 2015/0273632 A1 | 10/2015 | Chen |
| 2015/0283614 A1 | 10/2015 | Wu |
| 2015/0343664 A1 | 12/2015 | Liu |
| 2015/0360418 A1 | 12/2015 | Shah |
| 2015/0375456 A1 | 12/2015 | Cheverton |
| 2016/0067923 A1 | 3/2016 | James |
| 2016/0082662 A1* | 3/2016 | Majer ................ B29C 64/153 264/409 |
| 2016/0114432 A1 | 4/2016 | Ferrar |
| 2016/0175935 A1 | 6/2016 | Ladewig |
| 2016/0236279 A1 | 8/2016 | Ashton |
| 2016/0243652 A1 | 8/2016 | El-Dasher |
| 2016/0279707 A1 | 9/2016 | Mattes |
| 2016/0322777 A1 | 11/2016 | Zediker |
| 2017/0371168 A1* | 12/2017 | Dewald ................ G02B 6/00 |
| 2018/0281065 A1 | 10/2018 | Perry et al. |

FOREIGN PATENT DOCUMENTS

| | | |
|---|---|---|
| EP | EP0402944 A2 | 12/1990 |
| EP | 2875897 A1 | 5/2015 |
| EP | 2926979 A1 | 10/2015 |
| EP | 2964418 B1 | 5/2019 |
| GB | 2453945 A | 4/2009 |
| JP | 5933512 B2 | 6/2016 |
| WO | 02/085009 A2 | 10/2002 |
| WO | 2006/043231 A1 | 4/2006 |
| WO | WO/2012/151262 A2 | 11/2012 |
| WO | 2014/179345 A1 | 11/2014 |
| WO | WO/2014/199134 A1 | 12/2014 |
| WO | WO/2014/199149 A1 | 12/2014 |

(56) References Cited

FOREIGN PATENT DOCUMENTS

| WO | WO/2014/074954 A3 | 1/2015 |
|---|---|---|
| WO | WO/2015/003804 A1 | 1/2015 |
| WO | WO/2015/017077 A1 | 2/2015 |
| WO | WO/2015/108991 A2 | 7/2015 |
| WO | WO/2015/114032 A1 | 8/2015 |
| WO | WO2015/114032 A1 | 8/2015 |
| WO | WO/2015/120168 A1 | 8/2015 |
| WO | WO/2015/191257 A1 | 12/2015 |
| WO | WO/2015/200138 A1 | 12/2015 |
| WO | WO2015/200138 A1 | 12/2015 |
| WO | WO/2015/134075 A3 | 1/2016 |
| WO | WO/2016/071265 A1 | 5/2016 |
| WO | WO/2016/079496 A3 | 6/2016 |
| WO | WO/2016/110440 A1 | 7/2016 |
| WO | WO/2016/201309 A1 | 12/2016 |
| WO | WO/2018/087218 A1 | 5/2018 |

\* cited by examiner

LIGHT RECYCLING FOR ADDITIVE MANUFACTURING OPTIMIZATION

CROSS REFERENCE TO RELATED PATENT APPLICATION

The present disclosure is part of a non-provisional patent application claiming the priority benefit of
U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in its entirety.

TECHNICAL FIELD

The present disclosure generally relates to optics and, more specifically, to an optical system that recycles rejected light in additive manufacturing applications.

BACKGROUND

In laser-based additive manufacturing systems, a mask is applied to pattern the light. The applied pattern enables the light to be split into negative and positive images, one used to build parts and the other potentially discarded. Liquid crystal based light valves allow for the spatial modulation of transmitted or reflected light by rotating the electromagnetic wave polarization state. A typical example would have polarized light "drive beam" passing through a liquid crystal filled light valve which then spatially imprints a pattern in polarization space on the drive beam. The polarization state of the light desired is allowed to continue to the rest of the optical system, and the unwanted state is rejected and thrown away to a beam dump or other energy rejection device.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure proposes an optical system suitable for reducing the light wasted in the additive manufacturing system as caused by rejection of unwanted light due to the pattern to be printed. The proposed optical system may be utilized in, for example and not limited to, laser-based additive manufacturing techniques where a mask is applied to the light. Advantageously, in various embodiments in accordance with the present disclosure, the thrown-away energy may be recycled and used to maintain high throughput rates. Moreover, the thrown-away energy may be recycled and reused to increase intensity to print more difficult materials.

By recycling and re-use rejected light, system intensity can be increased proportional to the fraction of light rejected. This allows for all the energy to be used to maintain high printing rates. Additionally, the recycling of the light potentially enables a "bar" print where a single bar sweeps across the build platform.

An additive manufacturing system is disclosed which has one or more energy sources, including in one embodiment, one or more laser or electron beams, positioned to emit one or more energy beams. Beam shaping optics may receive the one or more energy beams from the energy source and form a single beam. An energy patterning unit receives or generates the single beam and transfers a two-dimensional pattern to the beam, and may reject the unused energy not in the pattern. An image relay receives the two-dimensional patterned beam and focuses it as a two-dimensional image to a desired location on a height fixed or movable build platform (e.g. a powder bed). In certain embodiments, some or all of any rejected energy from the energy patterning unit is reused.

In some embodiments, multiple beams from the laser array(s) are combined using a beam homogenizer. This combined beam can be directed at an energy patterning unit that includes either a transmissive or reflective pixel addressable light valve. In one embodiment, the pixel addressable light valve includes both a liquid crystal module having a polarizing element and a light projection unit providing a two-dimensional input pattern. The two-dimensional image focused by the image relay can be sequentially directed toward multiple locations on a powder bed to build a 3D structure.

Figure 1A:
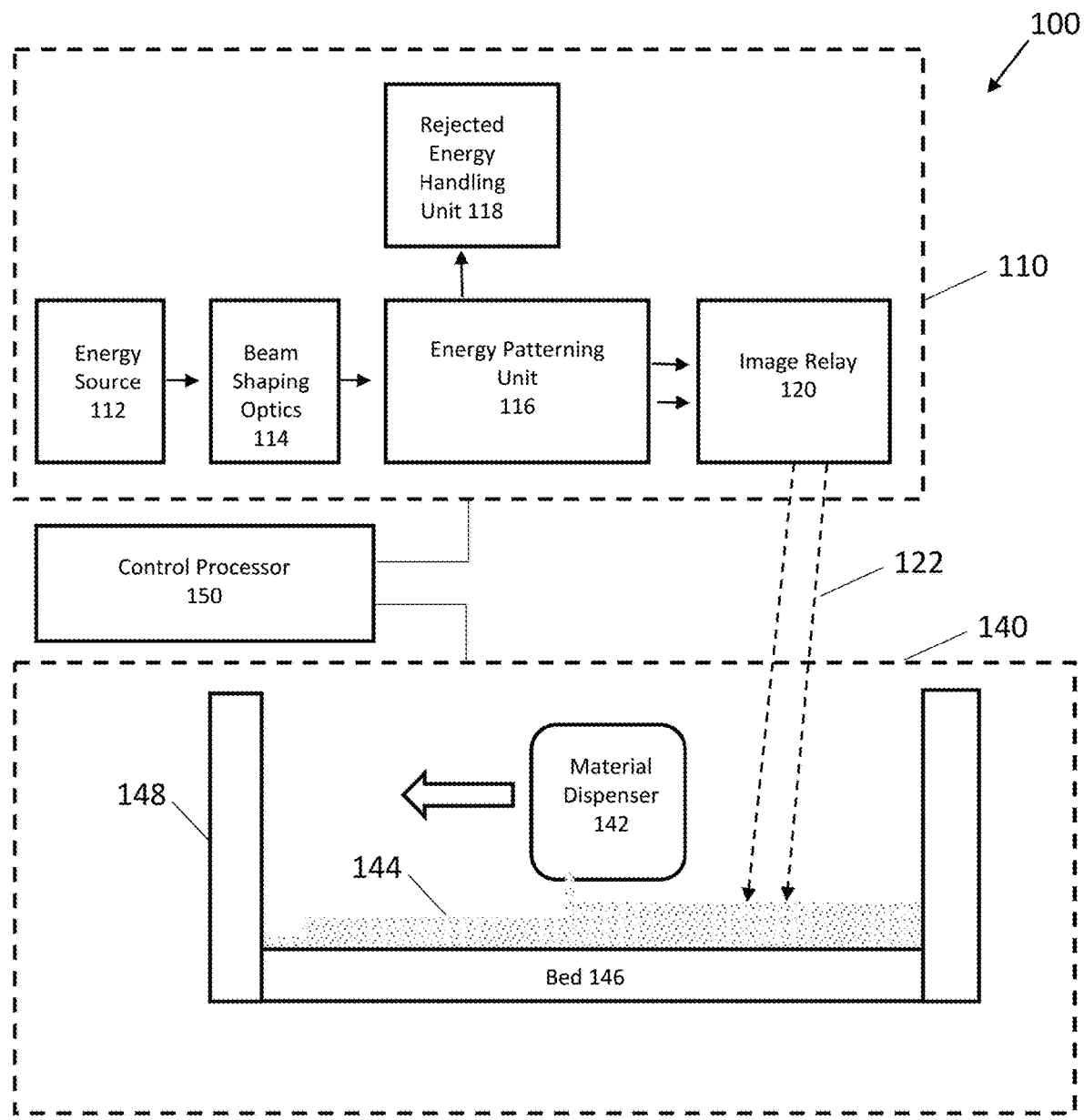
FIG. 1A illustrates an additive manufacturing system.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/$MnCl_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate (Nd:$YVO_4$) laser, Neodymium doped yttrium calcium oxoborateNd:$YCa_4O(BO_3)^3$ or simply Nd:YCOB, Neodymium glass (Nd:Glass) laser, Titanium sapphire (Ti:sapphire) laser, Thulium YAG (Tm:YAG) laser, Ytterbium YAG (Yb:YAG) laser, Ytterbium:$2O_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride (Ce:LiSAF, Ce:LiCAF), Promethium 147 doped phosphate glass ($147Pm^{+3}$:Glass) solid-state laser, Chromium doped chrysoberyl (alexandrite) laser, Erbium doped anderbium-ytterbium co-doped glass lasers, Trivalent uranium doped calcium fluoride (U:$CaF_2$) solid-state laser, Divalent samarium doped calcium fluoride (Sm:$CaF_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
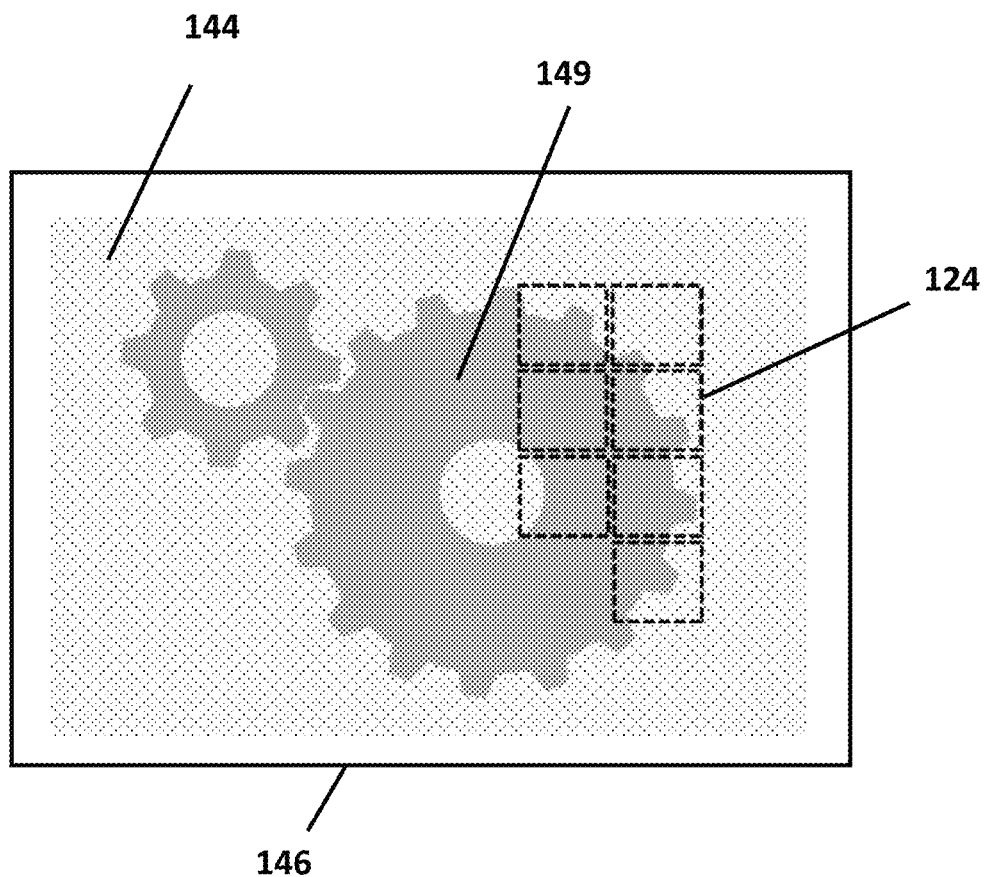
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
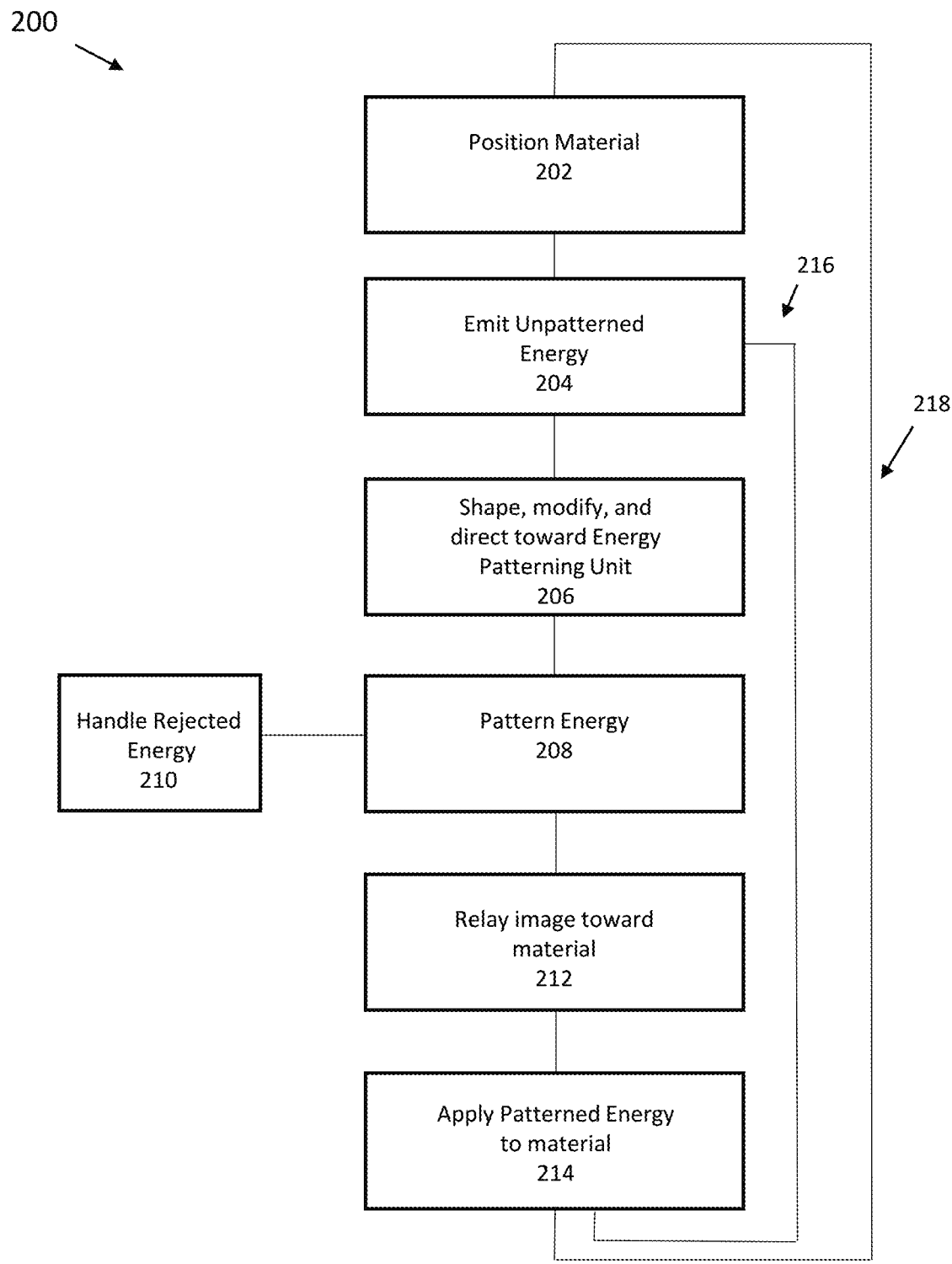
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
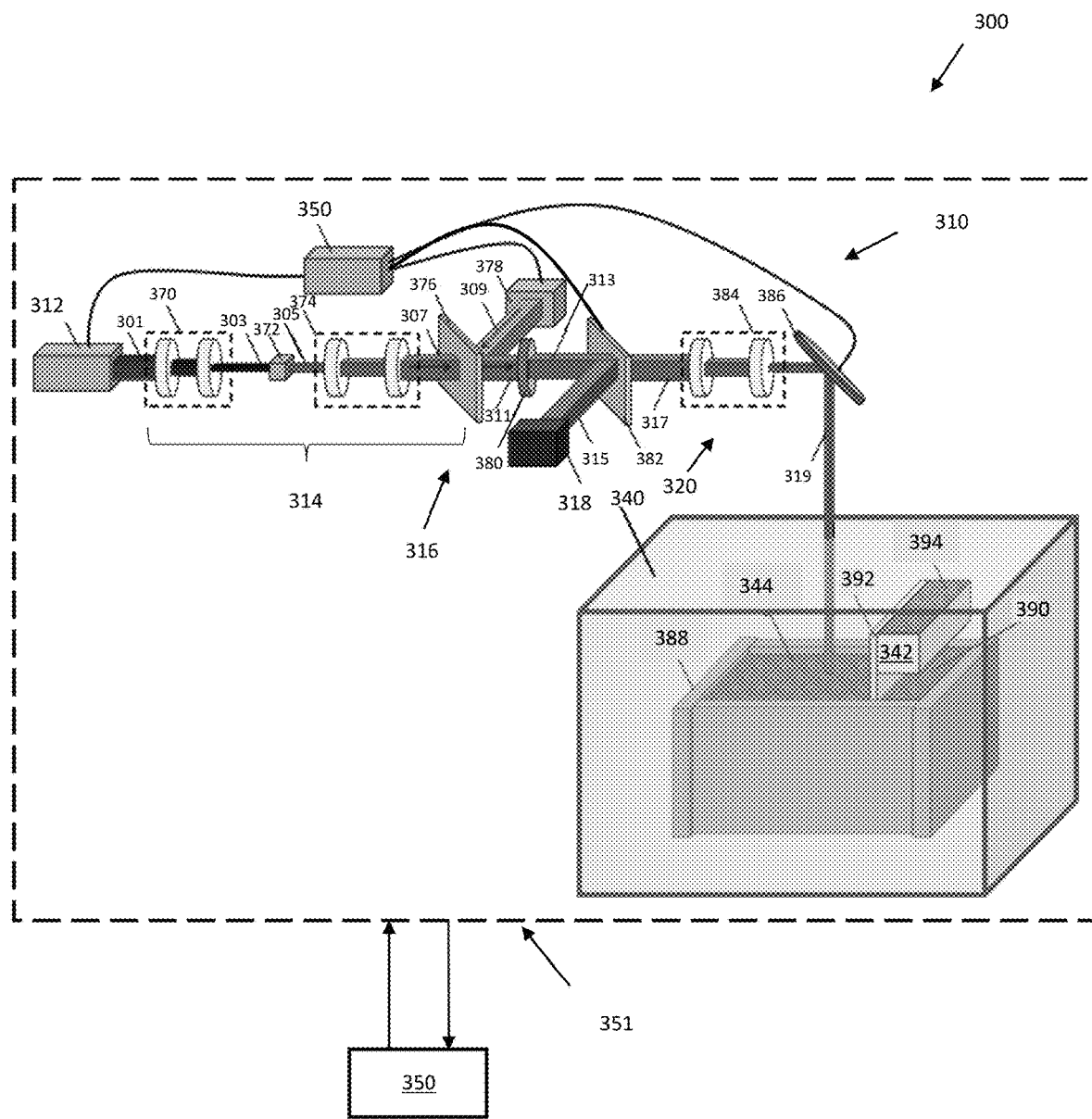
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
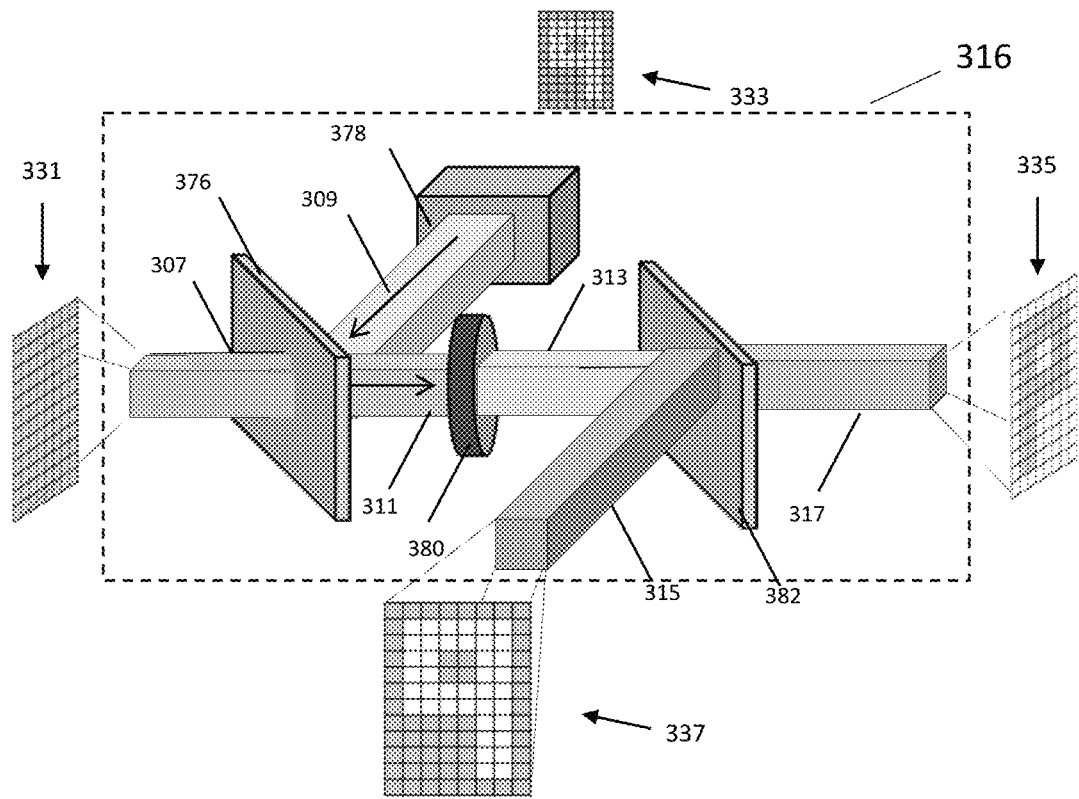
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
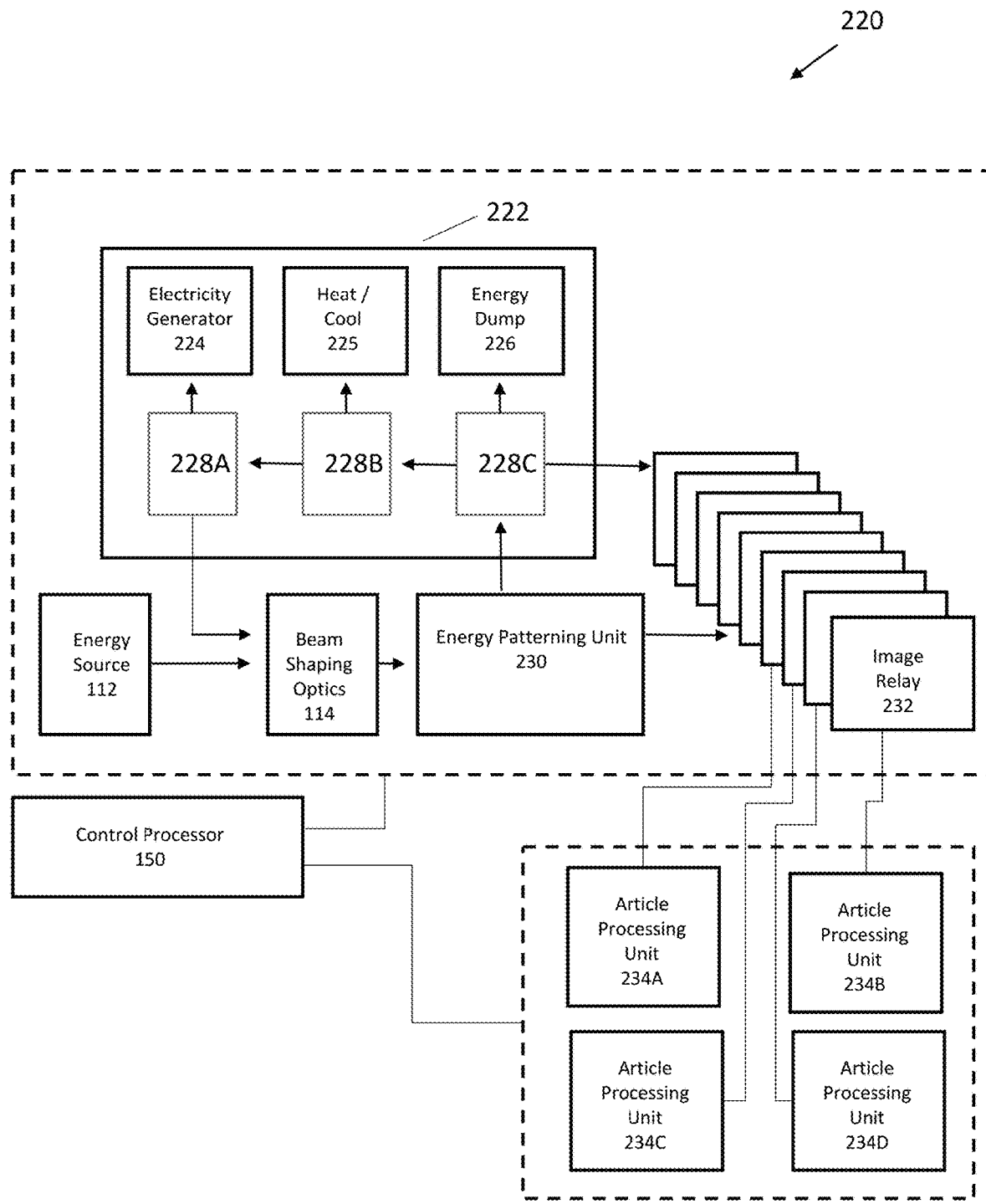
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
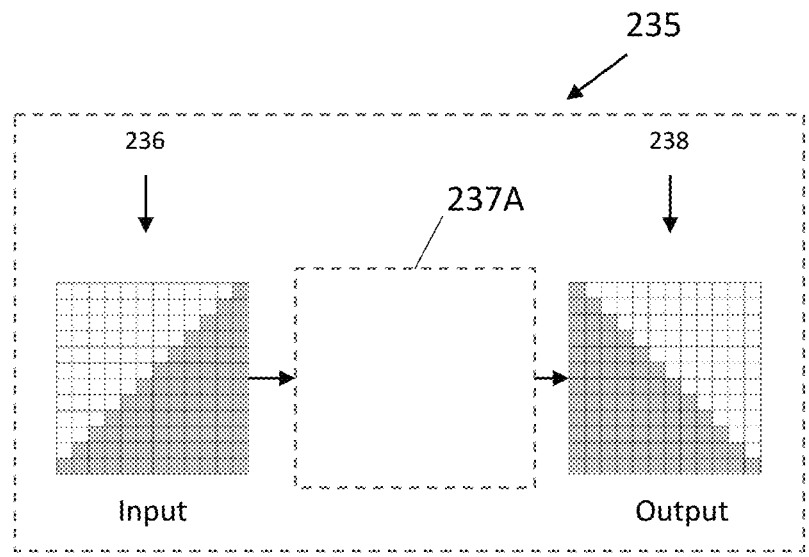
FIG. 3D illustrates a simple mirror image pixel remapping.

FIG. 3D is a cartoon 235 illustrating a simple geometrical transformation of a rejected energy beam for reuse. An input pattern 236 is directed into an image relay 237D capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
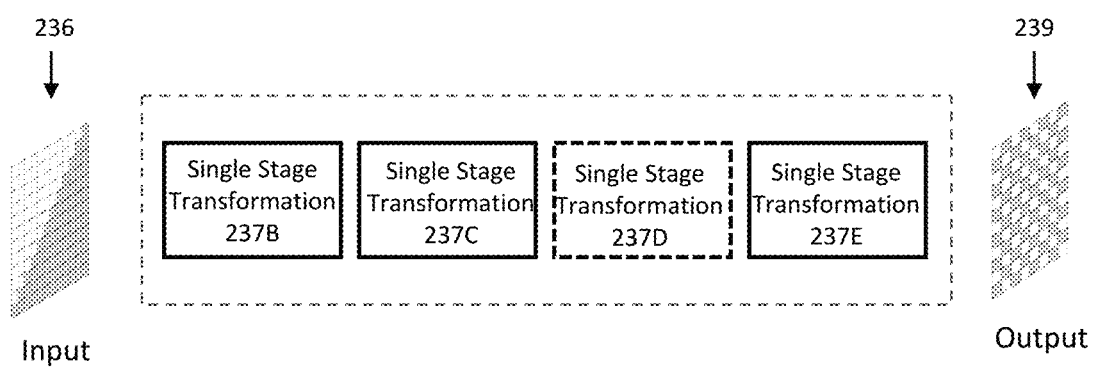
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
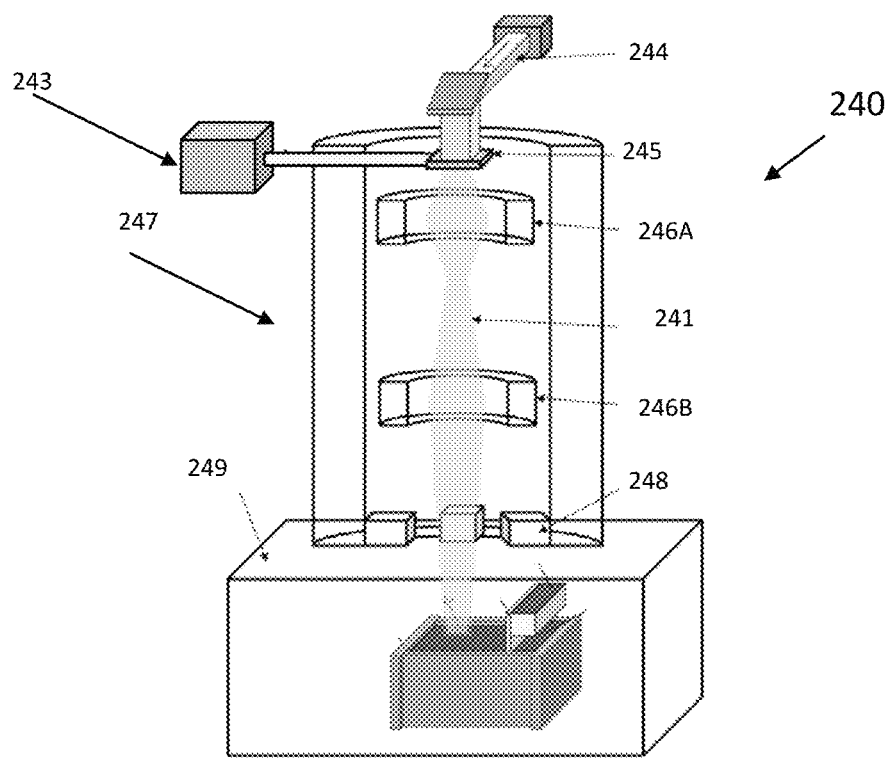
FIG. 3F illustrates an patternable electron energy beam additive manufacturing system.
Figure 3G:
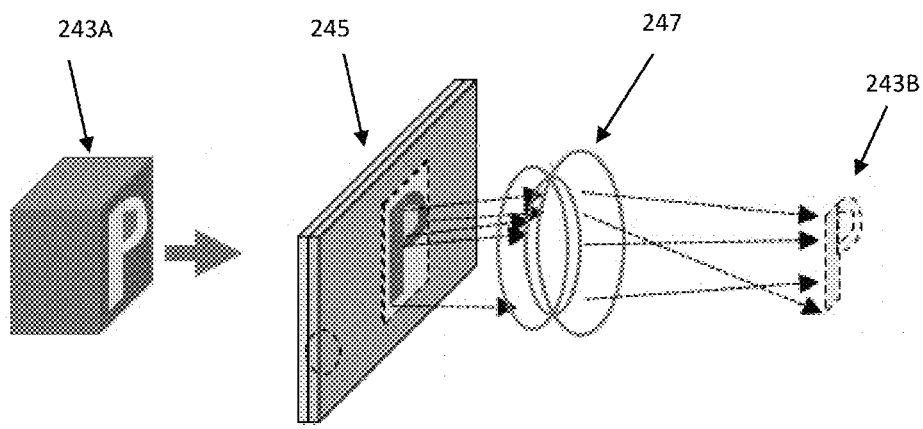
FIG. 3G illustrates a detailed description of the electron beam patterning unit shown in FIG. 3F

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

According to the present disclosure, an optical system capable of recycling rejected, unwanted and/or unused light is provided. Recycling and re-using unwanted light may increase the intensity of laser emitted light that is provided to a build platform. Moreover, recycling and re-using unwanted light may reduce energy costs associated with the system. By collecting, beam combining, homogenizing and re-introducing unwanted light rejected by a spatial polarization valve or light valve operating in polarization modification mode, overall transmitted light power can potentially be unaffected by the pattern applied by the light valve. This advantageously results in an effective re-distribution of the light passing through the light valve into the desired pattern, thereby increasing the light intensity proportional to the amount of area patterned. This has particular use with regards to advanced additive manufacturing methods using powder bed fusion techniques (such as those described herein with respect to FIGS. 1A-3B) and in particular with laser additive manufacturing. This is because increased intensity can allow for shorter dwell times and faster print rates to increase material conversion rate while maintaining efficiency.

By way of a light valve or light modulator, a spatial pattern of light can be imprinted on a beam of light. When optical intensity is of a concern or figure of merit of the optical system, conservation of system power is a priority. Liquid crystal based devices are capable of patterning a polarized beam by selectively rotating "pixels" in the beam and then passing the beam through a polarizer to separate the rotated and non-rotated pixels. Instead of dumping the rejected polarization state, the photons may be combined and homogenized with the original input beam(s) to the light valve. The optical path may be divided into three segments, including: 1) optical transmission fraction between light source(s) and light valve (denoted as "$f_1$" herein), 2) optical transmission fraction between light valve and source, e.g., accounting for the return loop (denoted as "$f_2$" herein), and fraction of the light valve that is patterned for the desired transmission state (denoted as "$f_p$" herein). The final light power may be expressed as follows in Equation 1:

$$P = P_0 \frac{(f_1 f_p)}{1 - f_1 f_2 (1 - f_p)}$$

Thus, according to Equation 1, as the transmission fractions $f_1$ and $f_2$ are increased to a full value of 1, the final power equals the initial power regardless of fraction of the beam that is patterned. The final intensity is increased relative to the initial intensity proportional to the amount of area patterned. This increased intensity requires compensation in the dwell time, however this is known a priori.

One example implementation of this concept is in the field of additive manufacturing where lasers are used to melt a powdered layer of material. Without beam recycling, as the patterned area fill factor decreases, the material print rate also decreases, thereby lowering the overall mass production rate of the printer. Compensation in dwell time due to recycling of the light is such that for higher intensities, the dwell time is shortened in a non-linear fashion. Shorter dwell times tend to result in ever faster print rates and faster overall mass conversion rates. This ability to increase the rate of material printing for low fill factor print areas enables an additive manufacturing machine to maintain high levels of powder to engineered shape conversion rates, hence resulting in a higher performance product.

A further example implementation of this concept is in the use of a bar of light which sweeps over the build platform and is modulated on and off as swept to create a two-dimensional (2D) solid layer from the powder substrate. The use of recycled light in conjunction with this example is novel. The use of a bar, swept over the entire build platform, requires that it needs to be capable of always printing at 100% fill factor. Typically, however, only 10-33% of the build platform is ever used. This low fill factor means that, on average, the capital equipment in laser power is 3 to 10 times oversized for the system. If, however, the light can be recycled, and bar sweep speed modified to match required dwell times proportional to the fill factor, then the print speed can be increased such that it is closer to the optimum fill factor efficiency. In such cases the capital equipment may be fully utilized. The ability to print with a swept bar of light enables unidirectional printing, thereby simplifying the gantry system required to move the light around. Such ability also allows for easy integration of the powder sweeping mechanism.

A further example implementation of the print bar concept includes a powder distribution system that follows the bar, laying down the next layer of powder as the previous layer is printed. Advantageously, this may minimize system down time.

Another example implementation of light recycling is to share light with one or more other print chambers. This example effectively makes the available laser light seem like an on-demand resource, much like electricity being available at a wall outlet.

Figure 4:
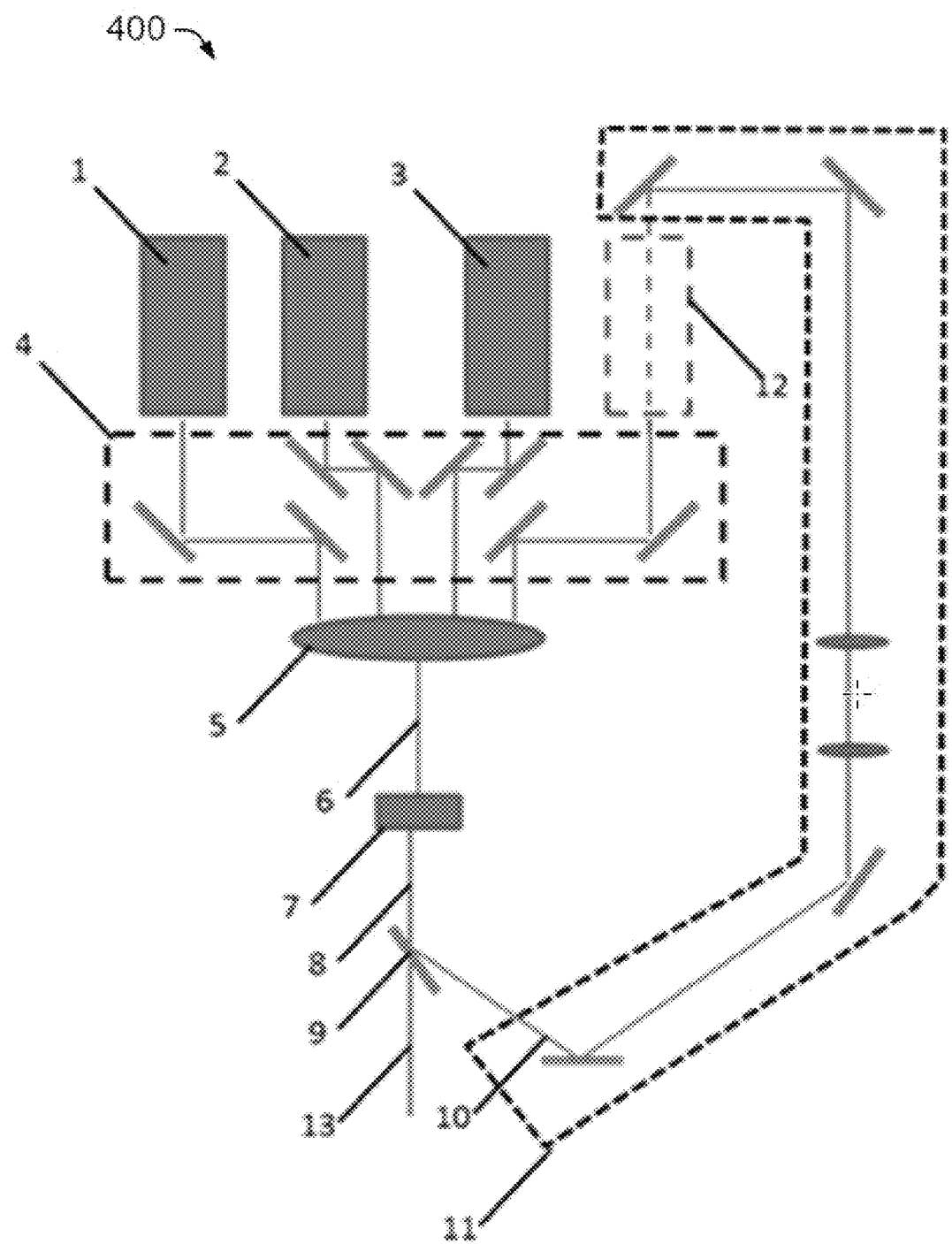
FIG. 4 is a diagram of a layout of an example apparatus for laser light recycling in an additive manufacturing process in accordance with an embodiment of the present disclosure.

FIG. 4 illustrates a layout of an example apparatus 400 for laser light recycling in the additive manufacturing process. Apparatus 400 may include one or more light sources such as, for example and without limitation, light sources 1, 2, and 3. In some embodiments, light sources 1, 2, and 3 may include lasers. Alternatively, other types of light sources such as solid state lasers may be utilized. In some embodiments, each or at least one of light sources 1, 2, and 3 may emit 11.1 kW of p-polarized light at 700 nm, having a size of 7.9 cm×7.9 cm, and 7.6 mrad in divergence. Beams of light emitted by light sources 1, 2, and 3 may be multiplexed together by a first optical assembly 4, which may include a series of mirrors, thus allowing the beams to be as close together as possible. These beams are then reshaped and blended by an optical device 5, resulting in a beam 6, 33.3 kW, 4.7 cm×4.7 cm and 70.4 mrad in divergence. Beam 6 may then be incident on a spatial polarization valve 7, that applies a spatial polarization pattern map on beam 6 by rotating the polarization of selected pixels from p-polarization to s-polarization to provide a beam 8. With suitable modifications, the selected pixels can be formed by rotating from s-polarization to p-polarization to provide the beam. In still other embodiments, grey scale pixels can be created by partial rotations. Transmission losses between light sources 1, 2, and 3 and beam 8 may be given by Equation 1 and denoted as $f_1$. Upon interaction with a polarizer 9 the s-polarization state of beam 8 may be reflected into a beam 10. The exact fraction may be given by the fraction of light that is patterned by a spatial polarization valve 7 which is given in Equation 1 and denoted as $f_p$. Beam 10 may enter a second optical assembly 11, which may include a series of mirrors, re-shaping lenses, waveplates, or other optical components, and may be modified into a 7.9 cm×7.9 cm beam and then re-introduced to the system as if it were a light source 12, along with the original one or more light sources 1, 2, and 3, with losses given by Equation 1 and denoted as $f_2$. Power in the final transmitted beam 13 may be given by Equation 1 where $P_0$ is the initial total beam power from light sources 1, 2, and 3. With $f_1=88.89\%$, $f_2=99.25\%$, and $f_p=40\%$, total transmitted power is 28.3 kW or 85% of the total emitted power from the light sources. On the other hand, without recycling, transmitted power would be 60% ignoring losses from $f_1$. This results in an effective increase in intensity of 2.12 times, with lasers as the light sources.

In some embodiments, the one or more light sources 1, 2, and 3 may include at least a solid state (e.g. fiber) laser, at least a semiconductor (e.g. diode) laser, or any combination thereof.

In some embodiments, spatial polarization valve 7 may include an optically addressed light valve or a liquid crystal display device.

In some embodiments, spatial polarization valve 7 may be configured to rotate a polarization of one or more pixels from p-polarization to s-polarization to provide the second beam of light. In some embodiments, polarizer 9 may be configured to reflect an s-polarization state of beam 8 as beam 10.

Figure 5:
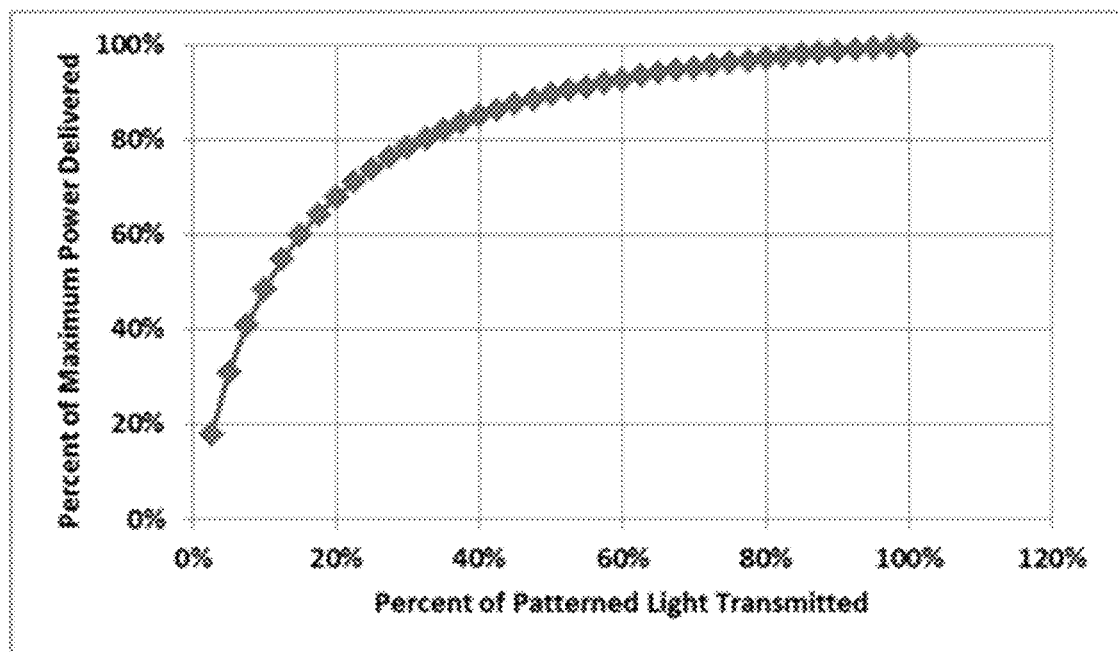
FIG. 5 is a diagram depicting the percent of maximum power delivered for various pattern fill factors in accordance with an embodiment of the present disclosure.

FIG. 5 illustrates Equation 1 plotted as the percent of maximum power delivered relative to the final transmitted beam 13 as a function of the amount of light rejected due to the applied polarization pattern $f_p$ where $f_1=88.89\%$, and $f_2=99.25\%$.

Figure 6:
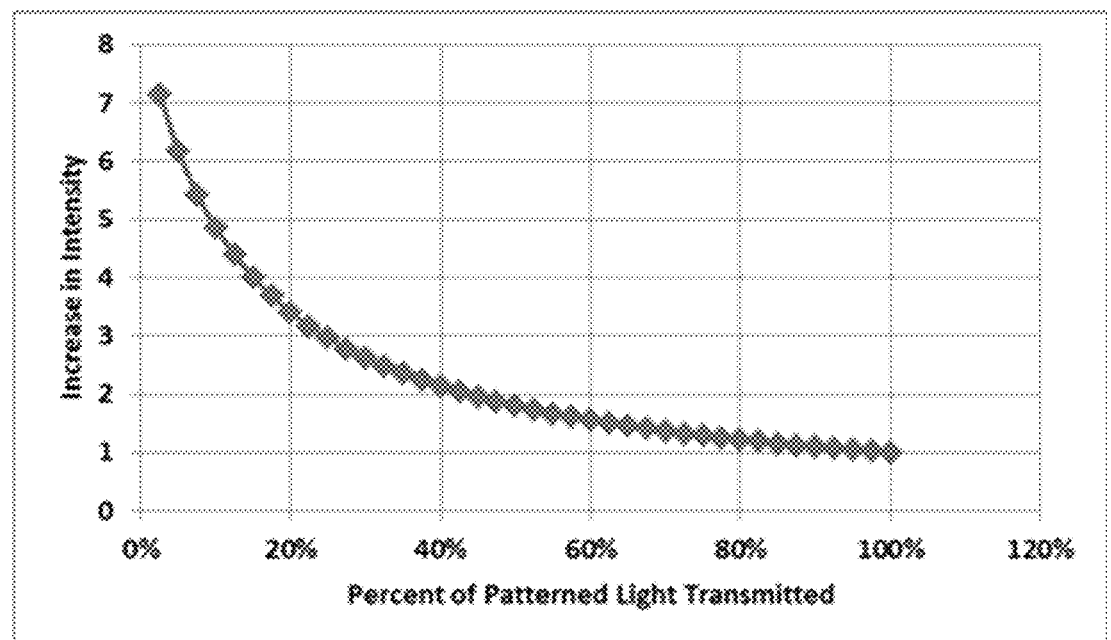
FIG. 6 is a diagram depicting the increase in intensity for various pattern fill factors in accordance with an embodiment of the present disclosure.

FIG. 6 illustrates Equation 1 plotted as the intensity increase using light recycling over the final transmitted beam 13 as a function of the amount of light rejected due to the applied polarization pattern $f_p$ where $f_1=88.89\%$, and $f_2=99.25\%$.

Figure 7:
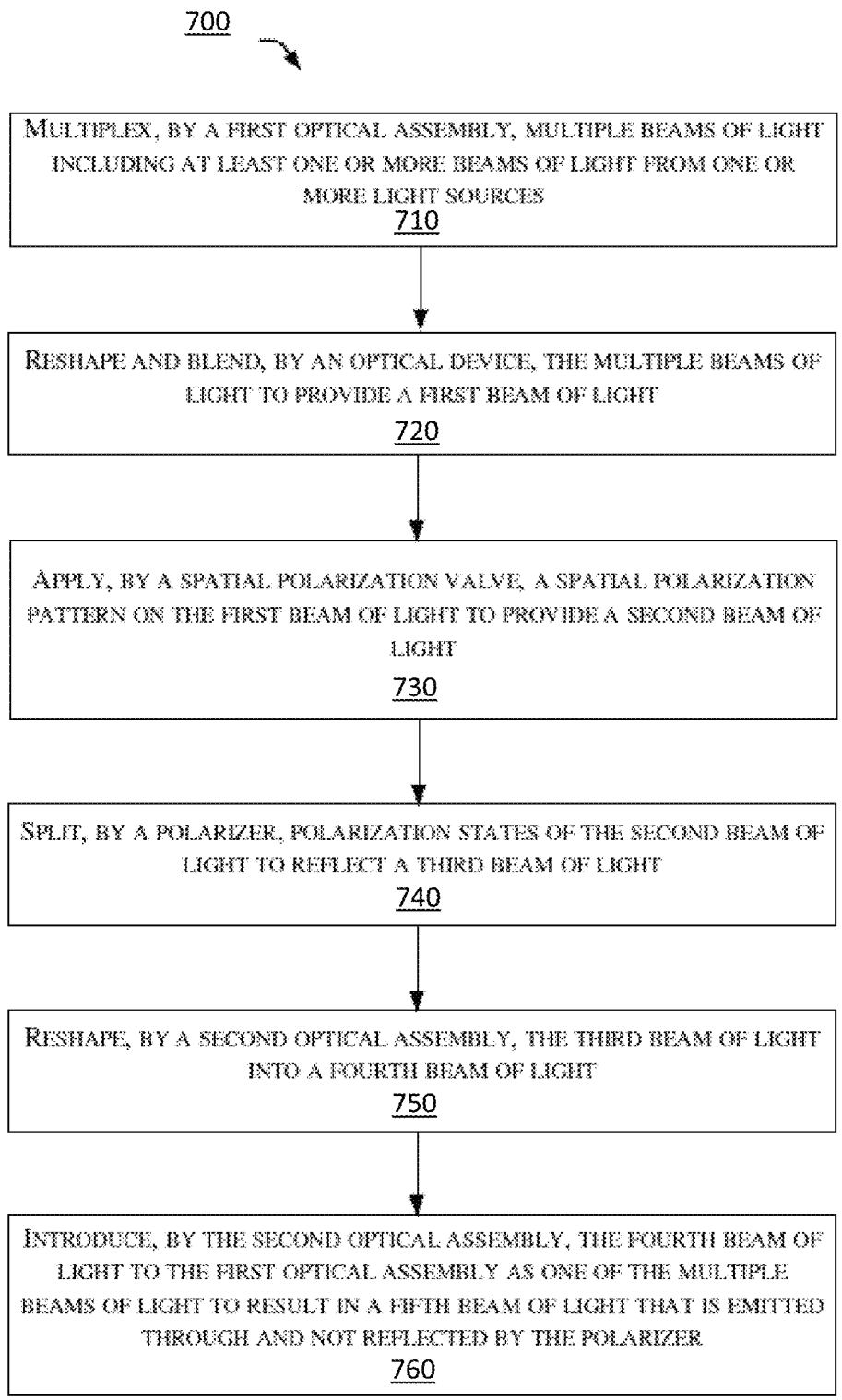
FIG. 7 is a flowchart of an example process in accordance with the present disclosure.

FIG. 7 illustrates an example process 700 in accordance with the present disclosure. Process 700 may be utilized to realize recycling and reuse of unwanted or otherwise rejected light in additive manufacturing in accordance with the present disclosure. Process 700 may include one or more operations, actions, or functions shown as blocks such as 710, 720, 730, 740, 750 and 760. Although illustrated as discrete blocks, various blocks of process 700 may be divided into additional blocks, combined into fewer blocks, or eliminated, depending on the desired implementation, and may be performed or otherwise carried out in an order different from that shown in FIG. 7. Process 700 may be implemented by apparatus 400 and any other suitable laser-based powder bed fusion additive manufacturing system. For illustrative purposes and without limiting the scope of process 700, the following description of process 700 is provided in the context of apparatus 400. Process 700 may begin with block 710.

At 710, process 700 may involve first optical assembly 4 of apparatus 400 multiplexing multiple beams of light including at least one or more beams of light from one or more light sources 1, 2, and 3. Process 700 may proceed from 710 to 720.

At 720, process 700 may involve optical device 5 of apparatus 400 reshaping and blending the multiple beams of light to provide a first beam of light (e.g., beam 6). Process 700 may proceed from 720 to 730.

At 730, process 700 may involve spatial polarization valve 7 of apparatus 400 applying a spatial polarization pattern on the first beam of light to provide a second beam of light (e.g., beam 8). Process 700 may proceed from 730 to 740.

At 740, process 700 may involve polarizer 9 of apparatus 400 splitting polarization states of the second beam of light 8 to reflect a third beam of light (e.g., beam 10). Process 700 may proceed from 740 to 750.

At 750, process 700 may involve second optical assembly 11 of apparatus 400 reshaping the third beam of light into a fourth beam of light. Process 700 may proceed from 750 to 860.

At 760, process 700 may involve second optical assembly 11 of apparatus 400 introducing the fourth beam of light to first optical assembly 4 as one of the multiple beams of light to result in a fifth beam of light (e.g., beam 13) that is emitted through and not reflected by polarizer 9.

In some embodiments, in receiving the multiple beams of light including at least one or more beams of light from the one or more light sources, process 700 may involve first optical assembly 4 receiving at least the one or more beams of light from at least a solid state laser or a semiconductor laser.

In some embodiments, in applying the spatial polarization pattern on the first beam of light, process 700 may involve applying the spatial polarization pattern on the first beam of light by spatial polarization valve 7 as an optically addressed light valve or a liquid crystal display device.

In some embodiments, spatial polarization valve 7 may be configured to rotate a polarization of one or more pixels from p-polarization to s-polarization to provide the second beam of light.

In some embodiments, an amount of power in the fifth beam of light (e.g., beam 13) may be expressed by an equation as follows:

$$P = P_0 \frac{(f_1 f_p)}{1 - f_1 f_2 (1 - f_p)}.$$

Here, P denotes the amount of power in the fifth beam of light; $P_0$ denotes an amount of power in the one or more beams of light emitted by the one or more light sources; $f_1$ denotes an optical transmission fraction between the one or more light sources 1, 2, and 3 and spatial polarization valve 7 (in the direction from the one or more light sources 1, 2, and 3 to spatial polarization valve 7); $f_2$ denotes an optical transmission fraction between spatial polarization valve 7 and the one or more light sources (in the direction from spatial polarization valve 7 to the one or more light sources 1, 2, and 3); and $f_p$ denotes a fraction of the first beam of light (e.g., beam 6) that is patterned by spatial polarization valve 7.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. An apparatus, comprising:
   one or more light sources configured to emit one or more beams of light;
   a first optical assembly configured to receive multiple beams of light including at least the one or more beams of light from the one or more light sources, the first optical assembly further configured to multiplex the multiple beams of light;
   an optical device configured to reshape and blend the multiple beams of light to provide a first beam of light;
   a spatial polarization valve configured to apply a spatial polarization pattern on the first beam of light to provide a second beam of light;
   a polarizer configured to split polarization states of the second beam of light to reflect a third beam of light; and
   a second optical assembly configured to reshape the third beam of light into a fourth beam of light, the second optical assembly further configured to introduce the fourth beam of light directly to the first optical assembly, in a direction along a direction of the one or more beams of light emitted by the one or more light sources, as one of the multiple beams of light received and multiplexed by the first optical assembly to result in a fifth beam of light of which portions are transmitted through and not reflected by the polarizer.

2. The apparatus of claim 1, wherein the one or more light sources comprise at least a solid state laser.

3. The apparatus of claim 1, wherein the one or more light sources comprise at least a semiconductor laser.

4. The apparatus of claim 1, wherein the spatial polarization valve comprises an optically addressed light valve.

5. The apparatus of claim 1, wherein the spatial polarization valve comprises a liquid crystal display device.

6. The apparatus of claim 1, wherein the spatial polarization valve is configured to rotate the polarization state of one or more pixels.

7. The apparatus of claim 6, wherein the polarizer is configured to reflect one polarization state of the light of the second beam of light as the third beam of light and transmit the second polarization state.

8. An additive manufacturing apparatus, comprising:
   a first optical assembly configured to receive multiple beams of light including at least the one or more beams of light from the one or more light sources, the first optical assembly further configured to multiplex the multiple beams of light;
   an optical device configured to reshape and blend the multiple beams of light to provide a first beam of light;
   a spatial polarization valve configured to apply a spatial polarization pattern on the first beam of light to provide a second beam of light directable toward a powder bed;
   a polarizer configured to split polarization states of the second beam of light to reflect a third beam of light; and
   a second optical assembly configured to reshape the third beam of light into a fourth beam of light, rotate its polarization state to that of the first beam of light, the second optical assembly further configured to introduce the fourth beam of light directly to the first optical assembly, in a direction along a direction of the one or more beams of light emitted by the one or more light sources, as one of the multiple beams of light received and multiplexed by the first optical assembly to result in a fifth beam of light that is transmitted through and not reflected by the polarizer.

9. The apparatus of claim 8, wherein the one or more light sources comprise at least a solid state laser or a semiconductor laser.

10. The apparatus of claim 8, wherein the spatial polarization valve comprises an optically addressed light valve or a liquid crystal display device.

11. The apparatus of claim 8, wherein the energy source is configured to provide the one or more incident beams to bond the powered materials by melting, sintering, alloying, or fusing of the powdered materials, or a combination thereof, to form one or more integral objects, and wherein the powdered materials comprise metallic, ceramic, and polymeric powders suitable for additive manufacturing.

12. The apparatus of claim 8, wherein the spatial polarization valve is configured to rotate the polarization state of one or more pixels.

13. The apparatus of claim 12, wherein the polarizer is configured to reflect an s-polarization state of the second beam of light as the third beam of light.

* * * * *